United States Patent [19]

Kiyosumi

[11] Patent Number: 4,855,952
[45] Date of Patent: Aug. 8, 1989

[54] DRAM HAVING PIP CAPACITOR INSIDE A TRENCH

[75] Inventor: Fumio Kiyosumi, Tokyo, Japan

[73] Assignee: Oki Electric Industry Co. Ltd., Tokyo, Japan

[21] Appl. No.: 134,867

[22] Filed: Dec. 18, 1987

[30] Foreign Application Priority Data

Dec. 23, 1986 [JP] Japan .................... 61-305265

[51] Int. Cl.$^4$ .............. G11C 11/24; G11C 11/34; H01L 29/06; H01L 29/78
[52] U.S. Cl. .................... 365/149; 365/182; 357/55; 357/236
[58] Field of Search ............ 365/149, 182; 357/23.6, 357/55, 59

[56] References Cited

U.S. PATENT DOCUMENTS

| | | | |
|---|---|---|---|
| 4,462,048 | 7/1984 | Ho et al. .................... | 365/149 |
| 4,566,025 | 1/1986 | Tastrzebski et al. .......... | 365/182 |
| 4,577,395 | 3/1986 | Shibata ....................... | 357/23.6 |
| 4,688,064 | 8/1987 | Ogura et al. ................. | 357/23.6 |
| 4,717,942 | 1/1988 | Nakamura et al. ............. | 365/149 |
| 4,737,838 | 4/1988 | Watanabe .................... | 357/23.6 |

OTHER PUBLICATIONS

"Scaling Consideration and Dielectric Breakdown Improvement of Corrugated Capacitor Cell (ccc) For Future DRAM" Sunami et al. IEDM 84, pp. 232–235 (1984).

Primary Examiner—Terrell W. Fears
Assistant Examiner—Melissa J. Koval
Attorney, Agent, or Firm—Spencer & Frank

[57] ABSTRACT

A semiconductor memory device comprises a silicon substrate; an insulating layer formed over this substrate comprising a first portion and a second portion; at least one monocrystalline silicon island formed within the insulating layer, separated from the silicon substrate by the first portion of the insulating layer and from one another by the second portion of the insulating layer, with at least one trench having a wall defined by a side of the at least one monocrystalline silicon island and extending into the first portion of the insulating layer; a lower electrode film formed inside each of the at least one trench in contact with the at least one monocrystalline silicon island; a dielectric film formed on the lower electrode; and an upper electrode film formed on the dielectric film. Information is stored as charged in a capacitor consisting of the lower electrode film, the dielectric layer, and the upper electrode film.

11 Claims, 6 Drawing Sheets

PRIOR ART

FIG.3

PRIOR ART

FIG.4

DRAM HAVING PIP CAPACITOR INSIDE A TRENCH

BACKGROUND OF THE INVENTION

This invention relates to a dynamic random-access memory device, more particularly to an improvement enabling higher levels of integration of memory cells comprising one transistor and one capacitor.

Dynamic random-access memory (DRAM) devices are being made with increasingly high densities of integration. In a DRAM, an information bit is stored as a capacitor charge in a memory cell usually comprising one capacitor and one transistor. An essential requirement for the attainment of extremely high integration densities is to reduce the size of this basic memory cell. In scaling down the cell size, however, it is necessary to maintain a certain minimum capacitance (generally considered to be 50 fF), because if the capacitance of the capacitor is too low, the circuit is susceptible to soft errors caused by alpha particles and to other malfunctions. Let C be the capacitance of the capacitor, $T_{ox}$ be the thickness of the silicon oxide ($SiO_2$) film, $\epsilon_{ox}$ be its dielectric constant, and S be the capacitance surface area. Then the following relation is approximately true:

$$C = \epsilon_{ox} S / T_{ox}$$

As DRAM integration density increases, the size of the memory cell decreases. With a conventional planar memory cell structure, the capacitor area S decreases proportionately and the necessary value of C can only be maintained by reducing the silicon oxide thickness $T_{ox}$, or increasing $\epsilon_{ox}$ by replacing silicon oxide with a material having a higher dielectric constant. Compensating for a reduced S by reducing $T_{ox}$ raises major problems, however. In to maintain the needed C, the silicon oxide must be made so thin that its dielectric breakdown voltage becomes inadequate and the incidence of structural defects rises. There are also problems in using dielectric materials with a higher dielectric constant than silicon oxide. Tantalum oxide ($Ta_2O_5$) has been considered as a candidate material, but a method of forming the necessary $Ta_2O_5$ films has not yet been established. Also, a high dielectric constant material is generally associated with a narrow band gap, which offers less resistance to current flow and allows increased leakage current, thereby degrading interface properties as compared with silicon oxide, and causing electrical instability and other problems. For these reasons, it appears difficult to replace silicon oxide with a different material. What is needed is therefore a memory cell structure that combines small cell size with large effective capacitor area.

Figure 2:
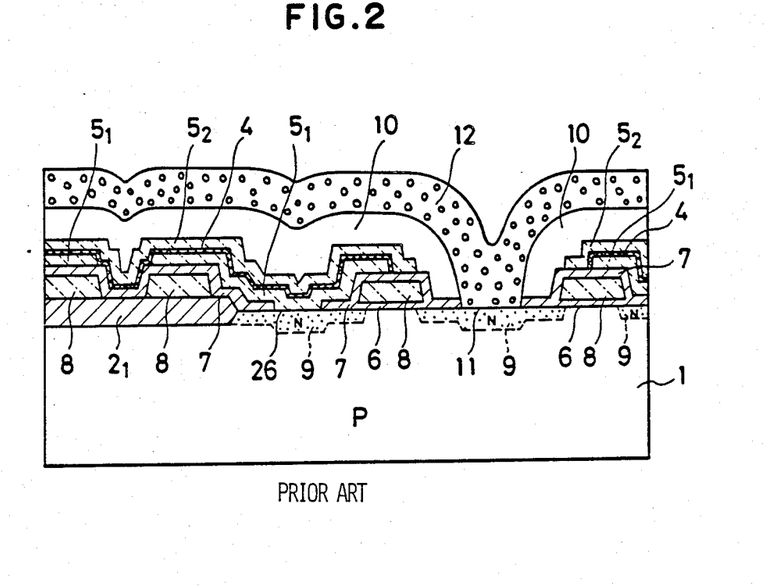
FIG. 2 and FIG. 3 are cross-sectional views of memory devices of the prior art.

For these reasons, megabit-class DRAMs have departed from the conventional two-dimensional planar memory-cell structure and begun using three-dimensional structures. Two examples of such three-dimensional structures are the stacked capacitor memory cell, in which the capacitor is stacked on top of the cell, and the trench capacitor memory cell, in which the capacitor is formed inside a trench in the semiconductor substrate. These structures enable a small memory cell to have a large effective capacitor area. In the stacked capacitor memory cell, shown in FIG. 2, the capacitor comprises a dielectric film 4 separating two polysilicon films: one acting as the charge storage electrode $5_1$; the other acting as the plate electrode $5_2$. The capacitor comprising these three films is stacked on top of a gate electrode 8 and a field oxide $2_1$, enabling a larger capacitor area, hence a greater capacitance, to be obtained than in a planar memory cell. Another advantage of this structure is that except at the contact 26 between the charge storage electrode $5_1$ and the diffusion region 9, the capacitor is separated from the silicon substrate, which reduces the susceptibility of the memory cell to alpha-particle-induced soft errors. A disadvantage of this structure as compared with the trench capacitor structure is that it offers less increase in effective capacitor area, permitting only a limited scaling down of memory cell size. Another disadvantage of a structure in which the capacitor is stacked on top of the memory cell is that the resulting surface unevenness presents an obstacle to fine patterning.

Figure 3:
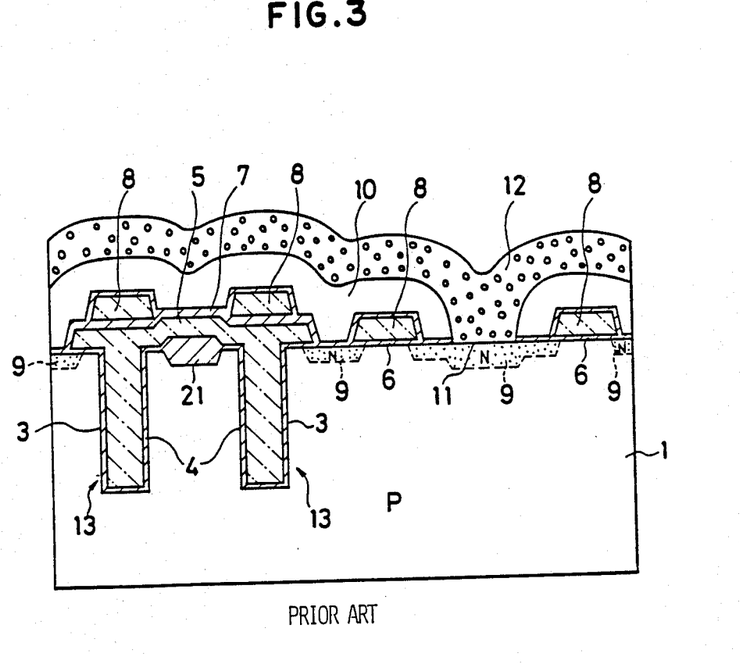

In the trench capacitor memory cell, shown in FIG. 3, the capacitor 13 is created in a trench 3 formed in a silicon substrate 1. A dielectric film 4 is grown on the inner surface of the trench 3, then the trench 3 is filled in with polysilicon which forms an electrode 5. Since the capacitor 13 is embedded in a trench 3, compensation for reduction in memory cell size can in principle be obtained by deepening the trench 3 to secure the surface area needed to maintain the required cell capacitance. The trench capacitor memory cell structure is thus advantageous for high levels of circuit integration.

A difficulty with the trench capacitor memory cell, however, is that the trenches of adjacent cells are not completely isolated from one another. If the trenches of adjacent capacitors are too closely spaced, so that their depletion layer approach too closely, leakage current tends to flow between the trenches, degrading such cell characteristics as maximum allowable voltage and charge retention. The trenches must therefore be kept a certain distance apart, placing a serious restriction on the scaling down of cell size. The trench spacing can be reduced if the silicon substrate is heavily doped with impurities to restrict extending of the depletion layer and block the flow of leakage current, but this method offers only a limited solution, because heavy doping also raises the threshold voltage of the transistors formed on the silicon substrate, so that their junction breakdown voltage becomes intolerably low. Another problem with this trench-capacitor memory cell structure is that it is inherently susceptible to alpha-particle-induced soft errors.

In summary, the stacked capacitor memory cell and trench capacitor memory cell of the prior art both offer advantages, but both also suffer from major disadvantages that limit the density of integration of the memory cells. A memory cell structure has been considered that combines the advantages of both by forming a PIP (Polysilicon-Insulator-polysilicon) capacitor of the type used in a stacked capacitor memory cell inside a trench. This memory cell structure, however, also has disadvantages. The scaling down of its size is limited by the need to form a thick oxide film inside the trench to isolate the lower electrode (the charge storage electrode) from the substrate, which tends to place stress on the trench silicon, and the need to open a contact hole at which the charge storage electrode can make contact with the substrate.

SUMMARY OF THE INVENTION

An object of this invention is to provide a memory cell structure that is free of the disadvantages of the memory cells of the prior art as discussed above and can be used in DRAM devices with ultra-large-scale levels of integration.

The semiconductor memory device includes a silicon substrate; an insulating layer formed over this substrate and comprised of a first portion and a second portion; at least one monocrystalline silicon island formed within this insulating layer on the first portion thereof, separated from the silicon substrate by the first portion of the insulating layer and laterally spaced from one another by the second portion of the insulating layer, with at least one trench having one wall defined by a side of the at least one monocrystalline silicon islands and extending into the first portion of the insulating layer, and the at least one trench having an opposite wall defined by the second portion of said insulating layer, the second portion of the insulating layer being disposed between monocrystalline silicon islands when there are two or more monocrystalline silicon islands and having an opposite wall defined by the second portion of a lower electrode formed on the inner surface of each of the at least one trench and making contact with the at least one monocrystalline silicon island; a dielectric film formed over the lower electrode; and an upper electrode formed over the dielectric film. Information is stored as charge in a capacitor including the lower electrode, the dielectric layer, and the upper electrode.

In the structure described above, the monocrystalline silicon islands are completely isolated by insulating layer 2 having first and second portions $2a$, $2b$, respectively. Adjacent trenches are therefore also completely isolated from one another, so no leakage current flows between them. Additionally, when one wall of the trench is formed by the edge of the second portion of the insulating film, the lower electrode inside the trench is surrounded by the insulating film, except where it makes contact with the monocrystalline silicon, hence the structure is protected from alpha particles. Furthermore, parasitic capacitance is reduced, owing to the SOI (Silicon On Insulator) configuration in which the monocrystalline silicon rests on the first insulating layer.

BRIEF DESCRIPTION OF THE DRAWINGS

FIG. 1A to FIG. 1I are a series of diagrams illustrating various stages in the fabrication process of a memory device embodying this invention.

DETAILED DESCRIPTION OF THE EMBODIMENTS

A preferred embodiment of the memory device of this invention will be described with reference to FIG. 1A to FIG. 1I and FIG. 4. The structure of this embodiment can best be seen in FIG. 1I and FIG. 4. FIG. 1I shows a cross section along line I—I in FIG. 4. The structure comprises a silicon substrate $1_1$, a first portion of an insulting layer $2a$ formed on the silicon substrate $1_1$ and consisting of a material such as porous silicon oxide, islands of monocrystalline silicon $1_3$ formed on the first portion of an insulating layer $2a$, a second portion of an insulating layer $2b$ that fills in the spaces between the silicon islands $1_3$ and joins with the first portion of an insulating layer $2a$, and trenches 3 extending through the monocrystalline silicon island $1_3$ and into the first portion of an insulating film $2a$.

Figure 4:
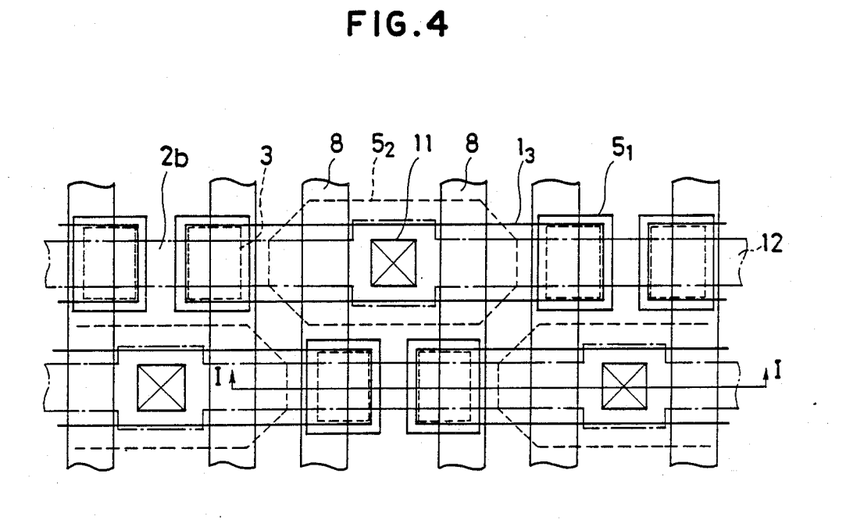
FIG. 4 is a plan view of the device illustrated in FIG. 1.

As is best seen from FIG. 4, the trench is in the form of a quadrangular prism and is formed at an end of the island $1_3$ so that three sides of the prism-shaped trench 3 are coincident or aligned with three edges of the island $1_3$. As a result, upper parts of the three sides of the prism-shaped trench 3 is defined by the second portion of an insulating layer $2b$. In other words, the trench 3 is defined by the monocrystalline silicon layer $1_3$ only at the upper part of the remaining site facing the center of the island $1_3$.

A lower electrode $5_1$ consisting of polysilicon is formed on the inner walls and floor of the trenches 3, a dielectric film 4 is formed over the lower electrode $5_1$, and the remaining space inside the trenches 3 is filled with polysilicon to create an upper electrode $5_2$. The lower electrode $5_1$, the dielectric film 4, and the upper electrode $5_2$ form an information charge storage capacitor. The lower electrode $5_1$ is the charge storage electrode; the upper electrode $5_2$ is the plate electrode.

The upper part of the lower electrode $5_1$ formed on one side of the trench 3 makes contact with the monocrystalline silicon layer $1_3$. An N-type diffusion region 9 is formed in this part of the monocrystalline silicon layer $1_3$, connected to the lower electrode $5_1$ by a contact 25. This N-type diffusion region 9 is part of an MOS transistor, other parts of the transistor being a second N-type diffusion region 9 and a gate electrode 8 (acting as a word line) located above a gate oxide film 6 situated over the channel between the two N-type diffusion layers 9. The second N-type diffusion region 9 is connected via contact window 11 to a bit line 12. The bit line 12 is isolated from the word line gate electrode 8 by an inter-layer insulation film 10.

With this structure, adjacent trenches 3 are completely isolated from each other by the silicon oxide layer having first and second portions $2a$ and $2b$, so leakage current does not flow between adjacent trenches as it does in the trench capacitor memory cell of the prior art. Excellent cell characteristics can therefore be obtained even if adjacent trenches are closely spaced. In addition, since three sides of the trench 3 are defined entirely by the silicon oxide layer having first and second portions $2a$ and $2b$ and the bottom of the trench 3 is defined by the silicon oxide layer's first portion $2a$, the lower electrode $5_1$ is isolated from the silicon substrate $1_1$ and the silicon island $1_3$ except at the contact 25 with the N-type diffusion region 9 at the upper part of one side of the trench 3, so the structure is highly resistant to alpha-particle-induced soft errors. Furthermore, the contact between the lower electrode $5_1$ and the N-type diffusion region 9 on the side wall of the trench 3 is self-aligned and does not require the opening of a contact window by conventional lithography techniques; this factor also contributes to small cell size. Finally, the SOI (Silicon On Insulator) configuration of the cell reduces its parasitic capacitance and improves its semiconductor device characteristics.

Figure 1A:
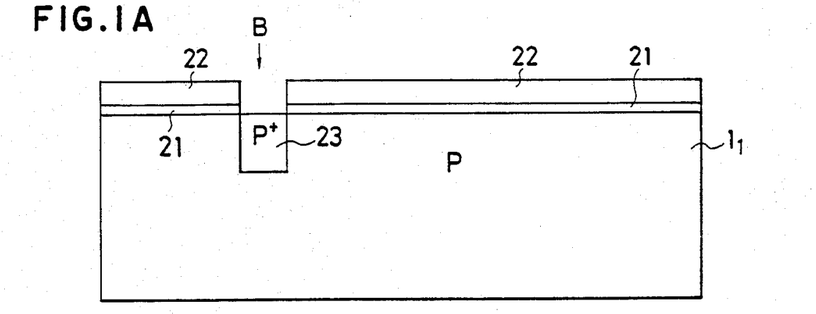
Figure 1B:
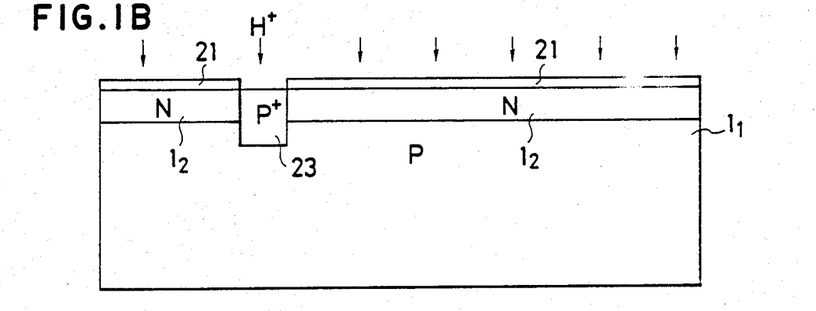
Figure 1C:
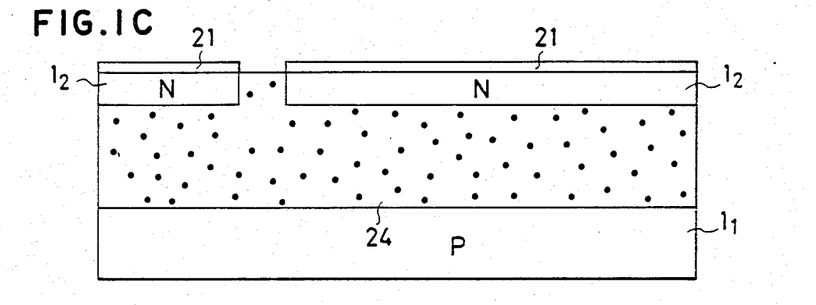
Figure 1D:
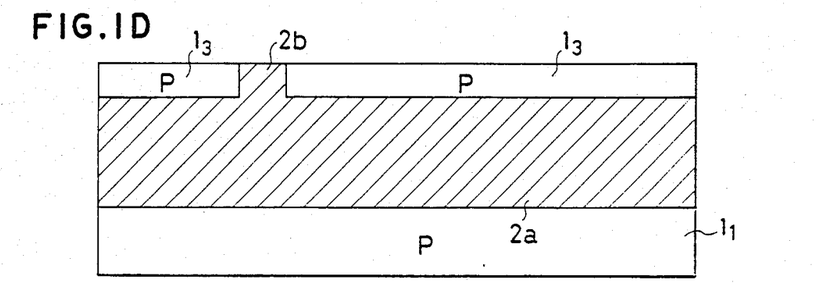
Figure 1E:
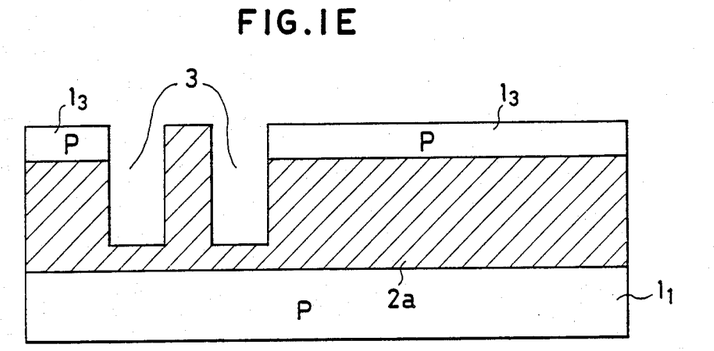
Figure 1F:
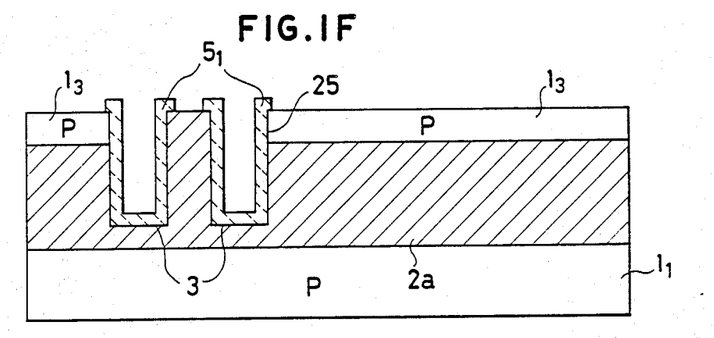
Figure 1G:
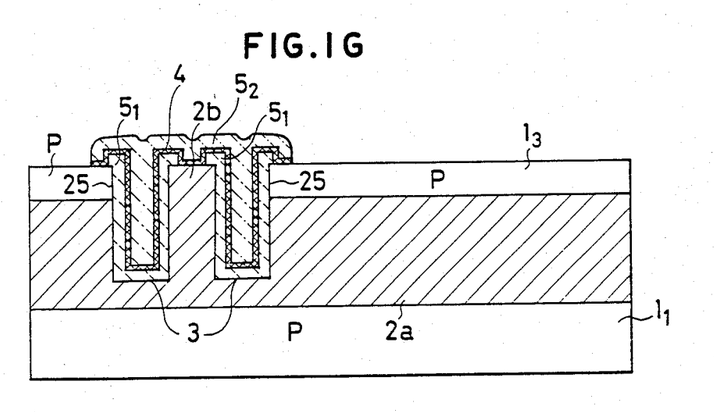
Figure 1H:
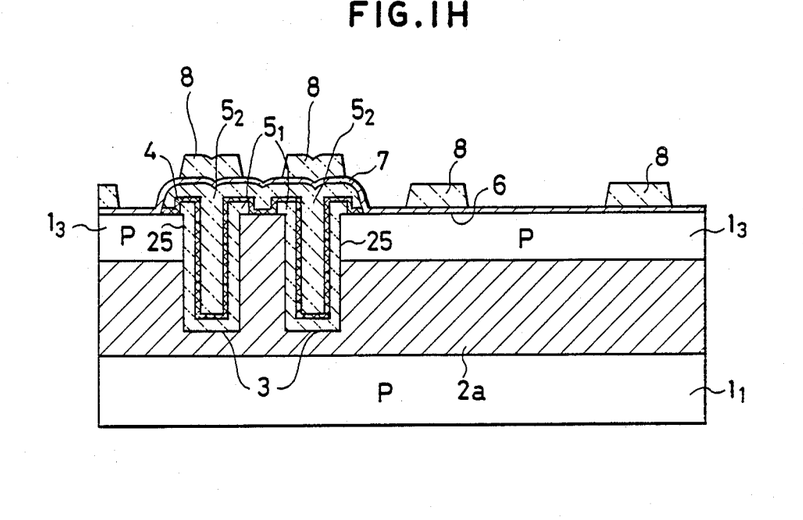
Figure 1I:
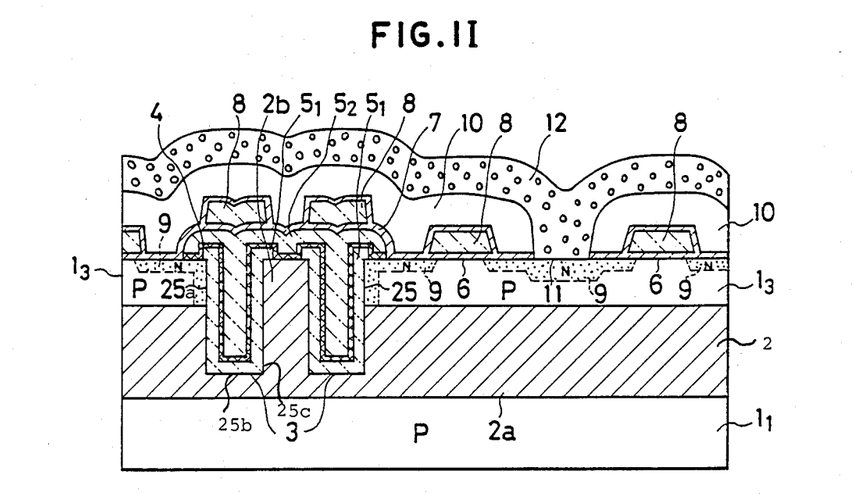

A preferred fabrication process for this memory device is illustrated in FIG. 1A to FIG. 1I. The process begins as in FIG. 1A with the deposition of a silicon nitride film 21 on a P-type silicon substrate $1_1$, formation of a resist 22 on the silicon nitride film 21 patterning of the resist 22 by lithography to create an etching mask, and etching of the silicon nitride film 21 to the desired pattern. Next a P+ silicon layer 23 is formed by boron ion implantation, after which the resist 22 is removed, hydrogen ions (protons) are implanted through the entire surface at an energy of 50 keV to 100 keV and dose of $5 \times 10^{14}$ cm$^{-2}$ to $10 \times 10^{14}$ cm$^{-2}$, and heat treatment is carried out at 500° C. to 600° C., forming an N-type silicon layer $1_2$ below the patterned silicon nitride film 21, as shown in FIG. 1B. The structure is then immersed in hydrofluoric acid (HF) with a concentration of about 40% and current is passed through it, using the silicon substrate $1_1$ as the anode. This anodization dissolves part of the P-type silicon, creating the porous silicon layer 24 shown in FIG. 1C. The next step is heat treatment in an oxidizing atmosphere at 1000° C. to 1100° C. The oxidation rate of the porous silicon film 24 is extremely fast, so it is quickly oxidized, leaving islands of N-type silicon layer $1_2$ isolated from the silicon substrate $1_1$ by thick porous silicon oxide layer having first and second portion 2a and 2b. The donors created by proton implantation disappear at heat treatment above 700° C., so the preceding oxidation process converts the N-type silicon layer $1_2$ to a P-type silicon layer $1_3$. Removal of the silicon nitride film 21 then leaves the structure shown in FIG. 1D. As is seen, the silicon oxide layer 2b isolates the islands $1_3$ from each other over their entire depth. In other words, the bottom of the oxide layer's second portion 2b is continous with the underlying oxide layer's first portion 2a and the top surface of the oxide layer's second portion 2b is coplanar with the top surface of the islands $1_3$. The isolation technique just explained is termed FIPOS (Full Isolation by Porous Oxidized Silicon) and has been described by Imai et al. in *IEDM Technical Digest* 376 (1981). The silicon oxide layer 2 formed by the preceding process consists of a first portion of an insulating layer 2 formed on the silicon substrate $1_1$ and a second portion of an insulating layer 2b that separates adjacent silicon layer $1_3$.

Next trenches 3 are formed to a depth of 3 μm to 6 μm by reactive sputter etching, penetrating the silicon layer $1_3$ and extending into the first portion of an insulating layer 2a as shown in FIG. 1E. The etching mask used during this reactive sputter etching comprises a silicon oxide film patterned by a lithographic technique, and a silicon nitride film. As is best seen from FIG. 4, the trench 3 is in the form of a quadrangular prism and is formed at an end of the island $1_3$ so that three sides of the prism-shaped trench 3 are substantially coincident with three edges at the island $1_3$. As a result, upper parts of the three sides of the prism-shaped trench 3 is defined by the second portion of an insulating layer 2b. In other words, the trench 3 is defined by the monocrystalline silicon layer $1_3$ only at the upper part of the remaining side facing the center of the island $1_3$.

To ensure that the three sides of the trench 3 are entirely defined by the insulating layer's first and second portions 2a and 2b, it may be so designed that three walls 25a, 25b and 25c are situated a little outside of the island $1_3$ to allow for errors in the alignment during fabrication process.

Next the lower electrode $5_1$, which forms the charge storage electrode of the capacitor, is created by depositing polysilicon doped with impurities to a thickness of about 2000Å and patterning it with a lithographic technique, as shown in FIG. 1F. A self-aligned contact is formed between one wall of the trench 3 and the silicon layer $1_3$, so there is no need to open a contact window with a separate lithographic process. The capacitor insulator 4 is created as shown in FIG. 1G by forming a thin silicon nitride film and/or silicon oxide film with a thickness of about 100Å to 150Å. The remaining space in the trench 3 is filled in with polysilicon doped with impurities to form an upper electrode $5_2$, the surface of which is smoothed by an etch-back technique. After patterning by lithography, this upper electrode $5_2$ forms the plate electrode of the capacitor. The capacitor of the memory cell thus comprises a lower electrode $5_1$, a dielectric film 4, and an upper electrode $5_2$ formed inside the trench 3.

Next as shown in FIG. 1H, a transistor gate oxide film 6 is formed with a thickness of approximately 150Å to 300Å. Over this gate oxide film 6 is deposited a polycide film 8 (a film consisting of polysilicon overlain by a molybdenum or tungsten silicide), which is patterned by a lithographic technique to create a gate electrode 8, which also acts as a word line. Instead of polycide, it is also possible to use silicide, or simply polysilicon.

The final steps, illustrated in FIG. 1I, use standard, well-known techniques to create the N-type diffusion layer 9 that form the transistor source and drain, create inter-layer insulation film 10 of phosphosilicate glass (PSG) or boro-phosphosilicate glass (BPSG), open contact windows 11, and create aluminum or aluminum-alloy metal wiring 12 for the bit lines. A standard, well-known technique is also used to create a protective layer, thereby completing the semiconductor device.

In this invention no leakage current flows between adjacent trenches, because they are completely isolated by insulating film portions. Except for the area of contact with the monocrystalline silicon, the entire wall of the trench is furnished by the first and second portions of the insulating film, which thus surround the lower electrode in the trench and provide protection from alpha-particle-induced soft errors. In addition, parasitic capacitance is reduced because of the SOI (Silicon On Insulator) configuration of the memory cell structure.

What is claimed is:

1. A semiconductor memory device comprising:
   a silicon substrate;
   an insulating layer formed over said substrate and comprised of a first portion and a second portion;
   at least one monocrystalline silicon island formed within said insulating layer on the first portion thereof, separated from said silicon substrate by the first portion of said insulating layer and laterally spaced from one another by the second portion of said insulating layer, with at least one trench having one wall defined by a side of the at least one monocrystalline silicon island and extending into the first portion of said insulating layer, and having an opposite wall defined by the second portion of said insulating layer, the second portion of said insulating layer being disposed between monocrystalline silicon islands when there are two or more monocrystalline silicon islands;
   a lower electrode formed on the inner surface of each said at least one trench and making contact with said at least one monocrystalline silicon island;
   a dielectric film formed over said lower electrode; and
   an upper electrode formed over said dielectric film;
   wherein information is stored as charge in a capacitor comprising said lower electrode, said dielectric layer, and said upper electrode.

2. A semiconductor memory device as set forth in claim 1, wherein sides of said second portion of said insulating layer form parts of the walls of the at least one trench.

3. A semiconductor memory device as set forth in claim 1, wherein the top surface of the second portion of said insulating layer is substantially coplanar with the top surface of said at least one monocrystalline island.

4. A semiconductor memory device as set forth in claim 1, wherein said at least one trench is in the form of a quadrangular prism and upper parts of three sides of each said at least one trench are defined by said second portion of said insulating layer.

5. A semiconductor memory device as set forth in claim 1, wherein said at least one trench is formed at an end of said at least one monocrystalline silicon island.

6. A semiconductor memory device as set forth in claim 1, wherein said insulating layer is made of porous oxidized silicon.

7. A semiconductor dynamic memory device comprising:
a silicon substrate;
an insulating layer formed over said substrate and comprised of a first portion and a second portion;
first and second conductive silicon islands formed within said insulating layer on the first portion thereof, separated from said silicon substrate by the first portion of said insulating layer and laterally spaced from one another by the second portion of said insulating layer,
first and second MOS transistor regions having diffusion regions formed respectively in said first and second conductive silicon islands,
first and second trenches disposed between said first and second conductive silicon islands, each having one wall defined by a side of one said first and second conductive silicon islands and each extending into the first portion of said insulating layer, and each having an opposite wall defined by the second portion of said insulating layer, the second portion of said insulating layer being disposed between said first and second conductive silicon islands;
a lower electrode formed on the inner surface of each of said first and second trenches and making contact respectively with said first and second conductive silicon islands;
a dielectric film formed over said lower electrode; and
an upper electrode formed over said dielectric film;
wherein information is stored as charge in a capacitor comprising said lower electrode, said dielectric layer, and said upper electrode.

8. A semiconductor dynamic memory device as set forth in claim 7, wherein said insulating layer is formed of silicon oxide.

9. A semiconductor dynamic memory device as set forth in claim 8, wherein the upper electrode has respective regions over said first and second trenches which are electrically coupled with each other.

10. A semiconductor dynamic memory device as set forth in claim 7, wherein said insulating layer is formed of porous silicon oxide.

11. A semiconductor dynamic memory device as set forth in claim 10, wherein the upper electrode has respective regions over said first and second trenches which are electrically coupled with each other.

* * * * *